United States Patent [19]

Wöss et al.

[11] Patent Number: 4,962,328
[45] Date of Patent: Oct. 9, 1990

[54] CHARGE AMPLIFIER CIRCUIT WITH DRIFT COMPENSATION

[75] Inventors: Gerhard Wöss; Klaus Leitmeier, both of Graz, Austria

[73] Assignee: AVL Gesellschaft für Verbrennungskraftmaschinen und Messtechnik mbH., Prof.Dr.Dr.h.c. Hans List, Austria

[21] Appl. No.: 301,086

[22] Filed: Jan. 25, 1989

[30] Foreign Application Priority Data

Jan. 25, 1988 [AT] Austria .................. 132/88

[51] Int. Cl.$^5$ ............ H03F 1/30; H03F 1/02
[52] U.S. Cl. .................. 307/491; 307/353; 330/9; 328/151
[58] Field of Search ........ 307/491, 352, 353; 328/162, 151, 127; 330/149, 9

[56] References Cited

U.S. PATENT DOCUMENTS

| | | | |
|---|---|---|---|
| 3,978,399 | 8/1976 | Chadbourne | 330/9 |
| 4,163,947 | 8/1979 | Weedon | 307/491 |
| 4,211,981 | 7/1980 | Lerma | 307/491 |
| 4,430,622 | 2/1984 | Simoes | 307/491 |

FOREIGN PATENT DOCUMENTS 377132  2/1985  Austria .
3632221 4/1987  Fed. Rep. of Germany .

Primary Examiner—Timothy P. Callahan
Attorney, Agent, or Firm—Hill, Van Santen, Steadman & Simpson

[57] ABSTRACT

A charge amplifier circuit for balancing drift between periodically occurring measured signals includes a drift-compensating device with a sample/hold unit which is triggered by a trigger device in accordance with the period of the measured signals. The trigger device is connected for supplying trigger pulses, so that the drift at an output of the charge amplifier, determined at the end of a compensation period, can be taken into account by the sample/hold unit to supply a compensating current to an input of the charge amplifier. The triggering of the sample/hold unit can be performed by external or internal triggering arrangements, so that simple measurements can be undertaken without a large outlay of equipment.

11 Claims, 3 Drawing Sheets

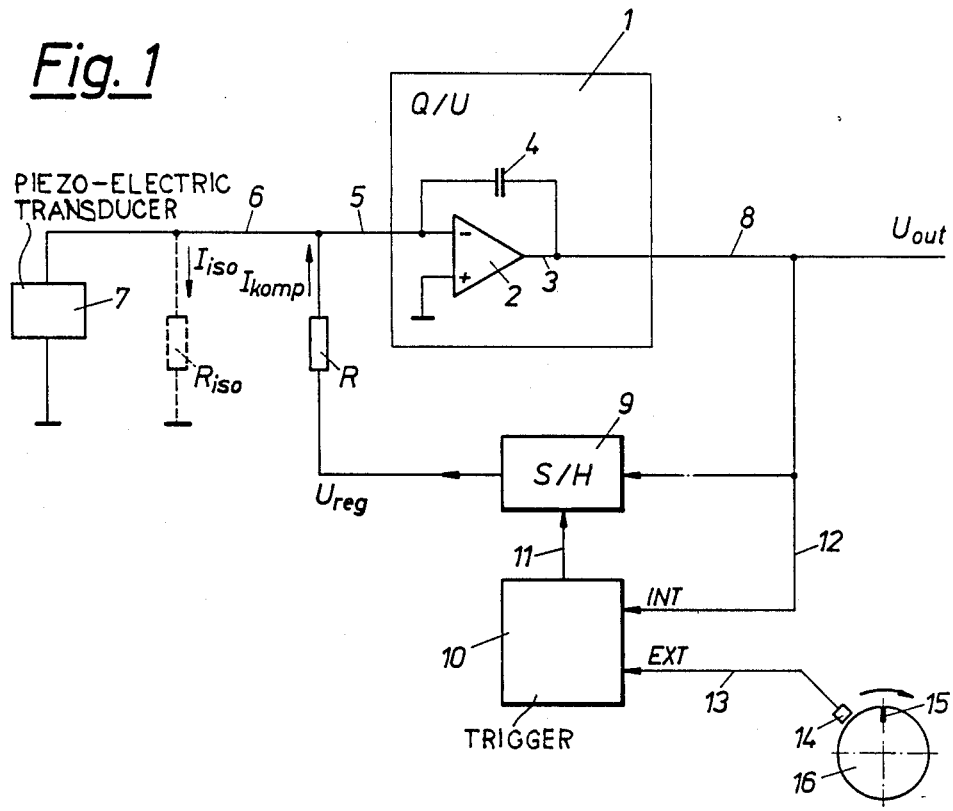
*Fig. 1*
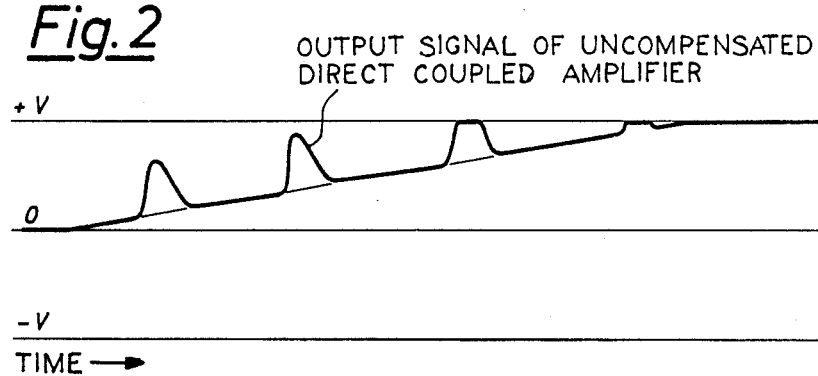
*Fig. 2* OUTPUT SIGNAL OF UNCOMPENSATED DIRECT COUPLED AMPLIFIER

CHARGE AMPLIFIER CIRCUIT WITH DRIFT COMPENSATION

BACKGROUND OF THE INVENTION

The invention relates to a charge amplifier circuit, the output of which is fed back to the signal input through a drift-compensating device, the drift-compensating device being connected to a trigger device via which a trigger signal can be supplied. When a trigger signal occurs, a compensating current corresponding to the drift of the signal output by the charge amplifier, is generated at the output of the drift-compensating device and applied to the signal input of the charge amplifier.

With charge amplifiers employed at the present day, for example, in connection with piezo-electric measuring systems, it is necessary either to use input stages with the highest possible isolation which give rise only to negligible input leakage currents, so that these input stages do not cause any disturbing drift of the output voltage of the charge amplifiers, or to balance out, by appropriate compensation, any disturbing drifting of the output voltage that may occur, to thereby eliminate the influence of the drifting on an amplified measure signal produced by the charge amplifier.

A circuit of the kind stated in the introduction and which operates on the basis of the second-mentioned principle is known, for example, from Austrian patent AT-PS 377.132. In the disclosed circuit of AT-PS 377.132, to compensate for the drift, there is provided at the output of the charge amplifier a circuit arrangement with a DC amplifier and an analog-digital converter, followed by a digital-analog converter and a resistor, through which, prior to the measurement, the input leakage currents are compensated automatically in a balancing phase by a compensating current, this current being held constant during the subsequent measuring phase. After actuation of the trigger device, in this known circuit, the most recently started digitizing process is halted and then the input of the charge amplifier is acted on by the compensating current corresponding to the last-determined drift, as long as the system is in the "measuring" mode.

This known circuit is suited for carrying out individual measurements, for example, such as those that arise in ballistics in connection with determining the pressure in the barrel of a weapon being fired. But, this circuit has only limited suitability for evaluating periodically occurring measured signals, especially when these periods are very short, such as, for example, in the evaluation of pressure measurements on high speed internal combustion engines. This is because, on the one hand, the forms of A/D converters and D/A converters capable of use for this purpose are relatively complicated and expensive and, on the other hand, in the known circuit there are no measurements performed or initiated for easily and conveniently introducing a periodic compensation in the intervals between the individually arising measured signals.

Regarding the last-mentioned deficiency, there is known an arrangement, for example, from West German laid open application DE-OS No. 36 32 221, which includes a circuit that is substantially distinguishable from that cited in the introduction, wherein, to stabilize the zero point of the output of the charge amplifier, the output signal is measured at a predetermined instant at which the desired voltage or desired measured value is known, and then is suddenly corrected to this value by a type of reset arrangement. The outlay of hardware rises as a consequence of the need to provide for this device individual trigger signals characterizing the periodic measuring signals and continuously running clock signals or angle marker signals. Further, because of the periodic resetting of the output of the charge amplifier, no significant measured signal can be relied upon for all variations of drifting.

SUMMARY OF THE INVENTION

It is an object of the present invention to provide an improved charge amplifier circuit of the kind stated in the introduction that avoids drawbacks of the known circuits. In particular, with periodically occurring measured signals, and specifically, with signals of short periods, an effective compensation for drift should be made possible by simple means.

To this end, the present invention provides, for balancing out drift of periodically occurring measured signals, a drift-compensating device comprising a sample/hold unit which is connected to the triggering device triggered in accordance with the period of the measured signals, for feeding the sample pulses. The sample/hold unit offers, especially in connection with relatively short repetition periods of the measured signal, for example, such as those that arise during monitoring of the pressure in a cylinder of an internal combustion engine, an alternative arrangement of substantially equal value but which is much simpler and more cost-effective than the combination of the two A/D and D/A converters in the aforesaid known circuit arrangement, which alternative, particularly in connection with the triggering of the trigger device for feeding the sample pulses, ensures a simple, effective and rapid compensation. In this arrangement the inclination of the base line of the measuring signal characterizing the zero point drift is altered periodically according to the drift, which is determined between the actual peaks of the signal train, so that overall, by virtue of the long-term integrating effect, a smooth compensation takes place and errors in the actual measured value are reduced to negligible amounts.

A particularly preferred embodiment of the invention is arranged so that the trigger device is provided with an external triggering arrangement which has at least one signal generator connected to it. The signal generator is employed for producing trigger signals associated with the occurrence of the processes which give rise to the periodic signals to be measured. The signal generator for providing this external triggering can, for example, be formed by a light cell cooperating with a mark on a disc on the crankshaft or camshaft of an engine, or an inductive or capacitive pick-up device. Whether the trigger signal delivered by the signal generator is simultaneous or is time-delayed with respect to the actual periodically occurring measured signals is relatively unimportant, so long as the periods or an n-multiple of the periods are synchronized or otherwise in step. So far as necessary, by appropriate selection or by the interposition of time-delay components or the like, it can be ensured that a sample pulse corresponding to a trigger signal pulse is produced at the appropriate or otherwise correct time—namely when the measured signal is at zero or the minimum between its periodically occurring peaks.

In a further embodiment of the invention, to ensure production of the sample pulses at the correct times, the signal generator is connected to a signal selection circuit in the trigger device, which, by picking out every n'th signal, prepares the train of trigger signals for forming the sample pulses. Thereby, for example, in the measurement of periodic processes in a four-stroke internal combustion engine with a signal generator mounted on its crankshaft to produce the trigger signals, it is very easy to arrange that only every second trigger signal pulse is selected to trigger the trigger device and thereby to produce the sample pulses, in order to take into account the overall period of the four-stroke cycle, which extends over 720° of crank angle. It will be understood that the circuit can also be arranged so that one is free to choose whether the first or the second of the trigger signals in each 720° period should be the one that leads to triggering of the trigger device.

In another particularly advantageous embodiment of the invention, the trigger device is provided with an internal triggering arrangement which is connected through a comparator unit to the signal output of the charge amplifier to initiate the production of the sample pulse between the occurrences of the measured signals which are observed. In this way, the instant at which the amount of the compensation is matched to the detected drift is completely independent of external devices and is derived solely from the amplified measured signal at the output of the charge amplifier. this requires a very small outlay in hardware and simplifies the performance of measurements of the most wide ranging kind.

In a further embodiment of the invention, the internal triggering arrangement comprises a clock generator and a counter unit, which counter unit is connected to the output of a comparator., the output of the counter unit initiating the production of a sample pulse when a predetermined count has been reached. This is a very easy way of releasing the sample pulses between the peaks of the measured signal as observed. In this arrangement, the counting unit can, for example, have separate parts (i.e., counters) handling the rising and falling edges of the measured signals so that in cooperation with the comparator and the clock generator, it is possible to determine the time interval where the measurement signal is below a predetermined threshold signal level. This time interval can then, for example, be halved, and the corresponding sample pulse can be passed to the sample/hold unit in the period after the expiration of this half-interval span.

In a further particularly preferred embodiment of the invention, there is a change-over switch for selectively feeding either a trigger pulse generated by the external triggering arrangement, or a trigger pulse generated by the internal triggering arrangement, to the sample/hold unit, at will. This broadens the possible uses of the charge amplifier circuit according to the invention and allows for optimum matching of same to a given measurement situation without modification of the circuit.

In yet another embodiment of the invention, a DC amplifier is connected ahead of the signal input of the sample/hold unit, the output of the sample/hold unit being fed through a further DC amplifier, and a resistor following same, to the signal input of the charge amplifier. In this way, a sufficient compensating effect can be ensured, and in particular, a sufficiently high compensating current provided at the signal input of the charge amplifier, without having exact matching of the individual components.

The gain of the DC amplifier which follows the sample/hold unit can be variable, at least in steps as can be the resistor which follows it. This provides substantial advantages for widely varying measurement requirements, in particular in connection with charge amplifiers with adjustable sensitivity.

In a further advantageous embodiment of the invention, there is provided an interval monitoring unit that is connected to the supply of the trigger pulses to the sample/hold unit. This monitoring unit acts to set the sample pulse input to "high" when the intervals between trigger pulses exceed a predetermined duration, thereby switching the circuit arrangement over to a continuous drift compensation mode. In the continuous drift compensation mode, the output of the charge amplifier is continuously compensated rather than only once between measured signal peaks.

For example, during measurement on an internal combustion engine, when the engine runs at only a very low speed, the compensation circuit would become unstable as the intervals would last so long that compensation would occur too infrequently to prevent the charge amplifier from running into saturation. The determined amount of compensation could also become so large that when compensation takes place, there is overcompensation and the charge amplifier is driven into saturation in the opposite direction. However, if the compensation circuit is placed in a continuous compensation mode when the intervals between the peaks of the measured signal becomes large or become effectively infinite (e.g., on account of the engine coming to a halt), then the drift of the output is continuously and permanently compensated, although, it will be understood that there can then be no meaningful use of the measured signal. An exception here would perhaps be the handling of very short-period signals as these would be virtually unaffected by the previous slow compensation. The advantage of this longer term compensation with longer intervals between the measured signal is that when measured signals or peaks again occur at short intervals, the charge amplifier is already compensated with regard to the drift of its output so that there is no need for any phasing-in at the start of a new series of measurements.

These features and other advantages are described in, and will be apparent from, the detailed description of the presently preferred embodiment and from the drawings.

BRIEF DESCRIPTION OF THE DRAWINGS

FIG. 1 illustrates a partial circuit diagram of a charge amplifier circuit embodying principles of the invention;

FIG. 2 illustrates a voltage/time diagram of an output signal of an uncompensated charge amplifier as it "drifts" into saturation;

DETAILED DESCRIPTION OF THE PRESENTLY PREFERRED EMBODIMENTS

Figure 3:
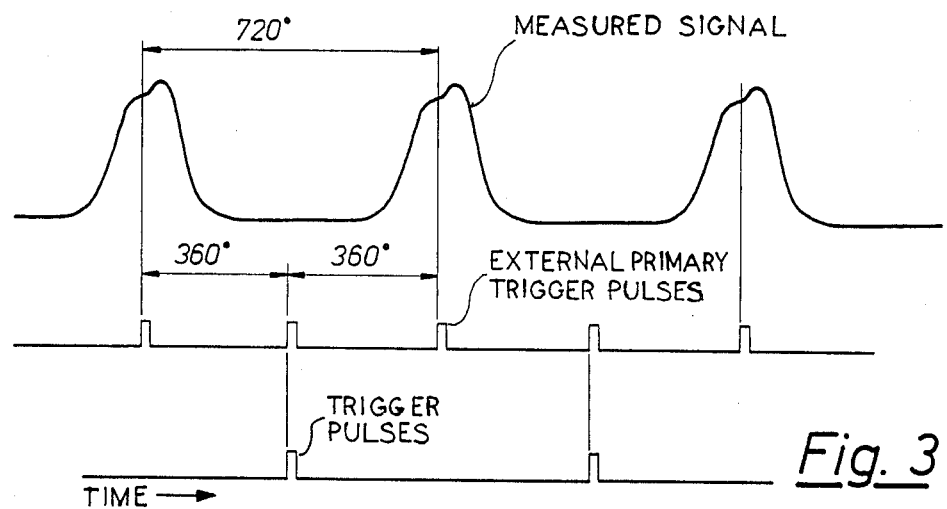
FIG. 3 illustrates a sequence of measured signals representing, for example, compression pressures of a four-stroke internal combustion engine, in juxtaposition with the associated trigger signals of an external triggering arrangement, as well as associated trigger signals for the drift compensation device, according to the present invention.

A charge amplifier 1 in FIG. 1 includes an operational amplifier 2 of which the output 3 is fed back through a capacitor 4 to the inverting input of the operational amplifier 2. As an alternative to this embodiment, the charge amplifier 1 could be constructed in any other suitable manner known to one of ordinary skill in the art.

Connected through a connection path 6 to a signal path input 5 of the charge amplifier 1 (and thereby in this case to the inverting input of the operational amplifier 2) is a piezo-electric transducer or pick-up 7, which can serve, in a manner not illustrated further here, for measuring the compression of an internal combustion engine.

As a consequence of unavoidable isolation resistances (represented by the resistor $R_{iso}$ illustrated in broken lines) a leakage current $I_{iso}$ flows and—in the absence of any compensation, as a consequence of the integrating action of the charge amplifier 1—causes drift of the output signal at the conductor 8 in the manner illustrated in FIG. 2. Here it should be noted that the relationships shown in FIG. 2 are illustrated in exaggerated form—in that in the charge amplifiers of the present day, the drift is substantially smaller than that illustrated in FIG. 2 relative to the periodically occurring measured signals, for example, arising in the usual speed ranges of an internal combustion engine; but this is not of importance for the present explanation. Also, the saturation levels illustrated in FIG. 2 are only to be regarded as examples.

Now, in order to be able to compensate the drift between (and, of course, also of) the periodically occurring measured signals, the output conductor 8 of the charge amplifier 1 is connected to a sample/hold unit 9 which in its turn is fed back through a resistor R to the signal input 5. Through a trigger device 10, pulses are fed via a conductor 11 as trigger signals to the sample/hold unit 9. The trigger signals occur in the time interval between the individual peaks of the measured signals and generate a compensating volta $U_{reg}$ corresponding to the prevailing measured drift. Thereby, through the resistor R, a compensating current $I_{comp}$ is applied to the signal input 5.

The primary trigger signals for the trigger device 10 can be produced either internally via a conductor 12 from the measured signal and in particular its train of peaks, or, externally via a conductor 13 from a signal generator 14 connected to it, this generator, for example, detecting a mark 15 on a disc 16 corotating with the crankshaft of the engine.

Illustrated in FIG. 3, is a plot of a measured signal, for example, the compression signal occurring every 720° of crank angle of a four-stroke internal combustion engine. The sequence of pulse signals below the measured signal represent the primary trigger signals from the external generator 14 delivered, for example, via the conductor 13, shown in FIG. 1. According to the working diagram of the four-stroke combustion engine, the primary trigger signals occur not only at compression top dead center, but also at exhaust top dead center. By a suitable circuit arrangement, using the pulse sequence illustrated at the bottom of FIG. 3, it is ensured that only those primary trigger signals which occur in the intervals between the peaks of the measured signal lead to sample pulses so that the drift can in fact be corrected as described, without any adverse effect on the actual measured signal.

Quite apart from the position of the primary trigger signals shown in FIG. 3, it will be understood that one could also produce a sequence F primary trigger signals displaced by a constant amount of crank angle, coinciding with the relevant dead center positions, as it is in fact only necessary to ensure that the trigger signal, supplied to the sample/hold unit 9 for the drift compensation, to occur in the valley of the wave between the peaks of the measured signal—where the signal should normally be zero, apart from minimal variations.

Figure 4:
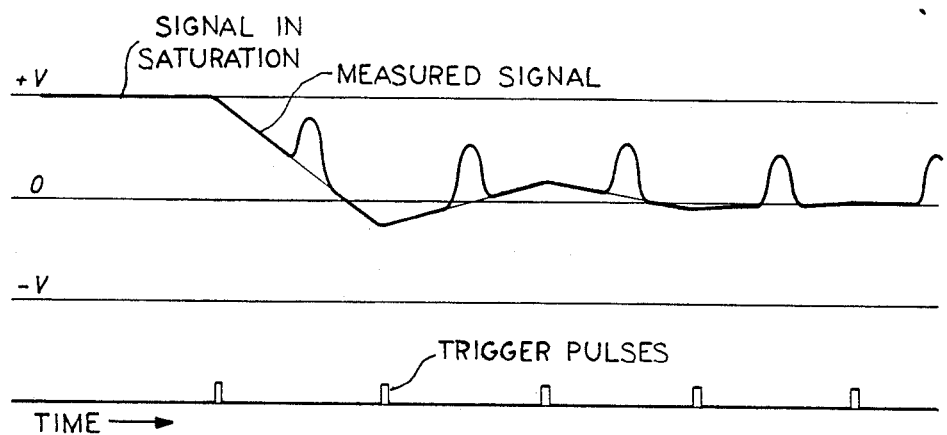
FIG. 4 is a voltage/time diagram showing the action of drift compensation, according to the present invention, on the output signal of the charge amplifier.

The upper signal sequence shown in FIG. 4 illustrates a measured signal which has run into saturation, in the left-hand part of the signal, as a result of the drift of the charge amplifier shown on the right-hand side of FIG. 2. At the start of the drift compensation according to the present invention, at first the maximum compensating current is applied to the signal input of the charge amplifier, whereby there is a degree of over-compensation and the base line of the measured signal sequence shown in FIG. 4 moves downward below the zero line. Accordingly, on the next sample signal which occurs, there is compensation in the opposite direction, but by a smaller amount. After a few cycles, the level indicated on the right-hand side of the measured signal is attained, in which the base line of the measured signal only continues to swing about the zero line by negligible amounts. As there is always some swinging of the starting and end values of the individual compensation cycles, the actual measured value which arises at approximately midway between the peaks is virtually unaffected by these variations.

Figure 5:
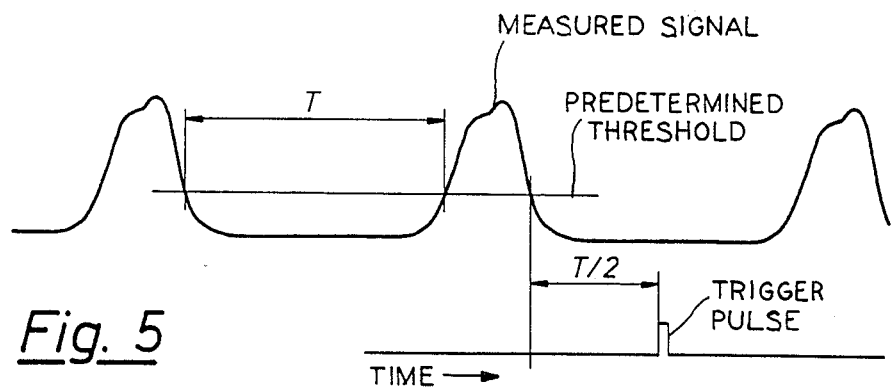
FIG. 5 illustrates a voltage/time diagram in which a measured signal diagram is placed in juxtaposition with an associated trigger pulse diagram to illustrate a possible timing arrangement according to principles of the invention for internal drift compensation.

In FIG. 5 it is now further shown that the "signal-free" period T, in which the actual measured signal lies below a predetermined threshold level, can also be halved by an appropriate circuit arrangement, whereby a trigger signal to be supplied to the sample/hold unit 9 can be produced in the interval after the instant T/2 following the moment the measured signal falls below the threshold level. In this way intervals of which the length varies, even during the measurement, for example, as a consequence of variations in the speed of an engine, can be handled very simply.

Figure 6:
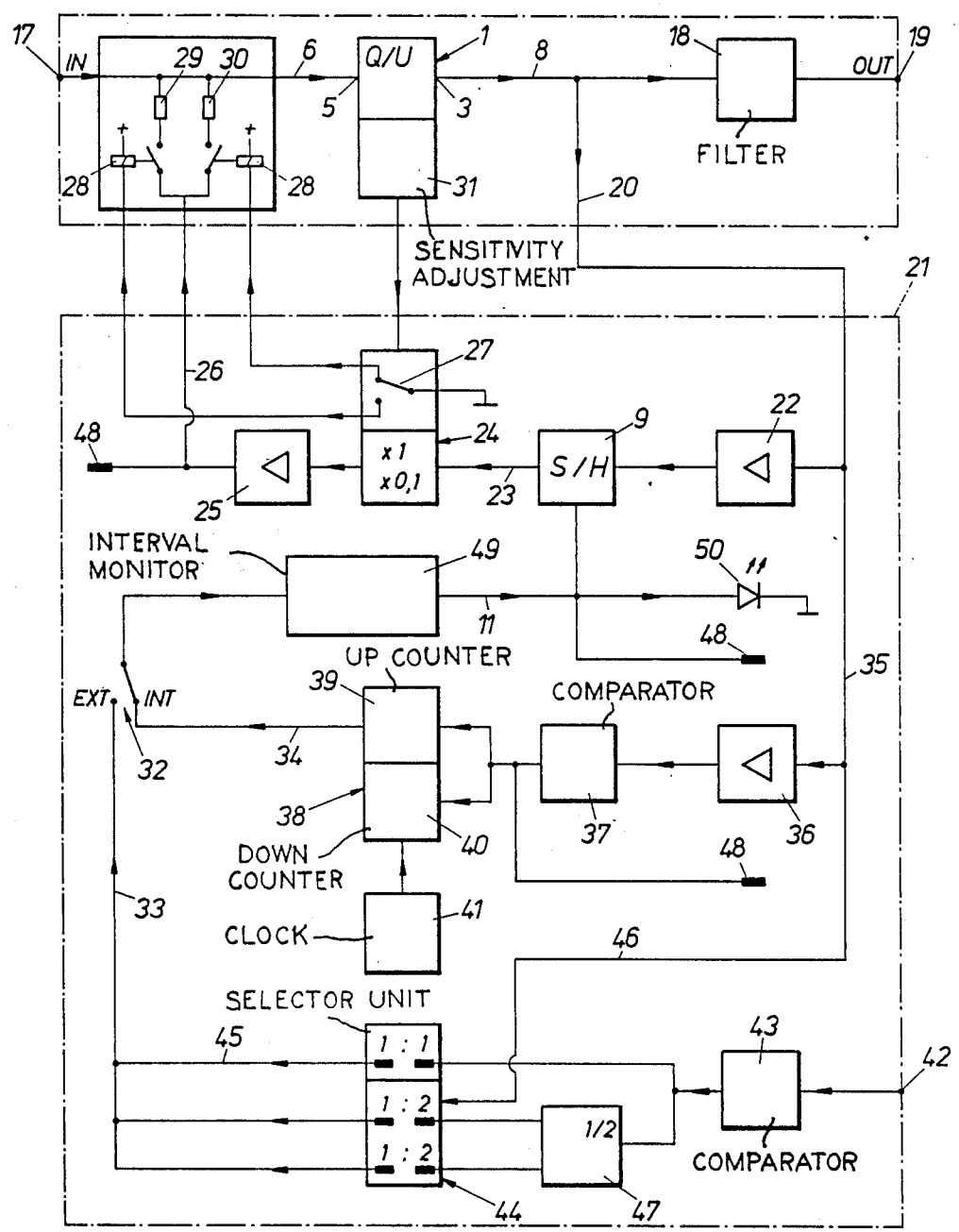
FIG. 6 illustrates a circuit diagram of another charge amplifier circuit according to further principles of the invention.

In the embodiment of the invention illustrated in FIG. 6, there is indicated an input 17 from a transducer or pick-up, not illustrated (e.g., the transducer 7 in FIG. 1), which is further connected through the lead 6 to the signal input 5 of the charge amplifier 1. The output 3 of the latter leads on the one hand to a unit 18 which provides additional filtering, amplifying or other desired functions or factors, not of consequence herein, on the measured signal, to produce a signal appearing at the output 19.

A drift-compensating device, indicated generally at 21, is connected to the output of the amplifier 1 via a lead 20. A DC amplifier 22 is inserted between the connection from the output signal of the amplifier 1 and the sample/hold unit 9. The output signal of the unit 9 is connected through a lead 23 and a change-over device 24 to a further DC amplifier 25. The output of the DC amplifier 25 can be connected through a lead 26, to either resistor 29 or resistor 30, via the switching arrangement including switch 27 of the change-over device 24 and cooperating relays 28. The resistors 29 and 30 (as well as the corresponding resistor R in FIG. 1) are in turn connected to the lead 6 and thereby to the signal input 5 of the charge amplifier 1. Quite apart from the possibility for switching over between the resistors 29 and 30, there is also the possibility, by means of the switch-over device 24 coupled to a sensitivity adjustment 31 of the charge amplifier 1, of switching the amplification of the DC amplifier 25 in steps, so that within wide limits, the compensating device 21 can he matched to the most widely differing circumstances determined by the measurement requirements or by the transducers used.

By means of a change-over switch 32, the trigger signal input of the sample/hold unit 9 can be fed at will with an externally generated trigger signal that is fed over a lead 33 or with an internally generated trigger signal that is fed over a lead 34. In the "internal" position illustrated in FIG. 6, the measured signal is branched off through a lead 35 ahead of a DC amplifier 22 and fed to a further DC amplifier 36 as well as subsequently to a comparator 37. The output signal of the comparator 37 is directed to a counter or counting unit 38 that has a down counter 39 and an up counter 40, which is connected further to a clock signal generator 41. In this way, the manner of operation of the compensation described in connection with FIG. 5 can be achieved directly; and to avoid repetition, will not be discussed further herein. The trigger signal pulse given as shown in the lower part of FIG. 5 then is directed to the sample/hold unit 9 through the lead 34 as described.

In the other "external" position of the switch 32, trigger pulses based on an external primary trigger signal delivered through an input 42 from a signal generator, not illustrated (see, for example, the primary trigger signal generator 14 in FIG. 1), are supplied to the sample/hold unit 9. The primary trigger signal is directed to a comparator 43. An output trigger signal of the comparator 43 is fed to a selector unit 44 which either (for example, in a two-stroke engine with a signal mark applied to the crankshaft) allows this trigger signal through its upper stage and directly through the lead 45 to the lead 33, or alternatively, in each of the two lower stages (for example, in connection with the measurement of compression in a four-stroke internal combustion engine in which a mark is provided on a crankshaft disc or the like) allows an internal modification on the trigger signal output by the comparator 43—this internal modification only being indicated here through a lead 46. In addition, the unit 47 serves to halve the train of trigger signals output by the comparator 43 that is supplied to the lowest stage of the selector unit 44.

Also in connection with FIG. 6, there is illustrated measurement and/or test points 48. The test points 48, however, have nothing to do with the circuit itself or with the manner in which the compensation for drift is carried out, other than being connected thereto to provide a point at which the circuit 21 can be tested.

Further, in the circuit arrangement of FIG. 6, there is provided an interval monitoring unit 49 which is inserted in the feed path of the trigger signal from the change-over switch 32 to the sample/hold unit 9. When a predetermined period of time elapses between trigger signal pulses, for example, 1.2 seconds, the interval monitoring unit 49 sets the output of the unit 49 to "high" and thereby the unit 21 to continuous drift compensation. As explained in the SUMMARY OF THE INVENTION, this serves to achieve the result that, when there are long intervals between the individual peaks of the measured signal, over-compensation, and hence instability of the compensation circuit, can be prevented. By means of an indicator, for example, an LED 50, the prevailing operating condition can be observed (e.g., a continuously illuminated indicator can indicate continuous compensation and flickering indicator can indicate periodic compensation).

It should be noted that instead of the reference value "zero" always assumed in the above explanations, for the output of the charge amplifier at the instant of the prevailing new drift-compensation, it will be understood that by taking suitable steps, any desired other standard value could be adapted by which the arrangement described will be compensated at a predetermined instant to a predetermined voltage level. Insofar as it is desired to provide additional leeway to vary the instant at which this compensation occurs, it will be understood that the appropriate train of primary trigger pulse signals can, for example, also be derived from a pick-up scanning a corresponding number of crankshaft angle marks.

While a preferred embodiment has been shown, modifications and changes may become apparent to those skilled in the art which shall fall within the spirit and scope of the invention. It is intended that such modifications and changes be covered by the attached claims.

We claim:

1. In a charge amplifier circuit, wherein an output of the amplifier is fed back through a drift compensating device, the drift compensating device being connected to a trigger device which directs a trigger signal to the drift compensating device to cause the drift compensating device to generate a compensating current corresponding to drifting of an output signal of the amplifier, the compensating current being directed to an input of the amplifier, the improvement comprising:

the drift compensating device including a sample/hold unit coupled to the trigger device and the output of the amplifier so that the drift is compensated according to drift values sampled between periodically occurring signals amplified by the amplifier, the trigger device supplying trigger signals to the sample/hold unit to trigger sampling by the sample/hold unit, the trigger device being provided with an external triggering arrangement that includes at least one signal generator which produces primary trigger signals associated with the occurrence of processes giving rise to the periodically occurring signals, the signal generator being connected to a signal selection circuit in the trigger device, which, by picking out every n'th signal, generates the trigger signal sequence directed to the sample/hold unit for forming sample pulses.

2. In a charge amplifier circuit, wherein an output of the amplifier is fed back through a drift compensating device, the drift compensating device being connected to a trigger device which directs a trigger signal to the drift compensating device to cause the drift compensating device to generate a compensating current corresponding to drifting of an output signal of the amplifier, the compensating current being directed to an input of the amplifier, the improvement comprising:

the drift compensating device including a sample/-hold unit coupled to the trigger device and the output of the amplifier so that the drift is compensated according to drift values sampled between periodically occurring signals amplified by the amplifier, the trigger device supplying trigger signals to the sample/hold unit to trigger sampling by the sample/hold unit, the trigger device being provided with an internal triggering arrangement which is connected to the signal output of the amplifier and which by means of a comparator unit initiates the production of the respective sample pulses between the occurrences of the detected measured signals.

3. In the circuit of claim 2, wherein the internal triggering arrangement comprises a clock generator and a counter unit connected to the output of the comparator unit, the output of the counter unit causing a trigger signal pulse to be produced when a predetermined count is reached.

4. In a charge amplifier circuit, wherein an output of the amplifier is fed back through a drift compensating device, the drift compensating device being connected to a trigger device which directs a trigger signal to the drift compensating device to cause the drift compensating device to generate a compensating current corresponding to drifting of an output signal of the amplifier, the compensating current being directed to an input of the amplifier, the improvement comprising:

the drift compensating device including a sample/-hold unit coupled to the trigger device and the output of the amplifier so that the drift is compensated according to drift values sampled between periodically occurring signals amplified by the amplifier, the trigger device supplying trigger signals to the sample/hold unit to trigger sampling by the sample/hold unit, the trigger device being provided with an external triggering arrangement that includes at least one signal generator which produces primary trigger signals associated with the occurrence of processes giving rise to the periodically occurring signals; and a change-over switch provided for selectively feeding to the sample/hold unit the trigger pulses generated by either the external triggering arrangement or an internal triggering arrangement.

5. In a charge amplifier circuit, wherein an output of the amplifier is fed back through a drift compensating device, the drift compensating device being connected to a trigger device which directs a trigger signal to the drift compensating device to cause the drift compensating device to generate a compensating current corresponding to drifting of an output signal of the amplifier, the compensating current being directed to an input of the amplifier; the improvement comprising:

the drift compensating device including a sample/-hold unit coupled to the trigger device and the output of the amplifier so that the drift is compensated according to drift values sampled between periodically occurring signals amplified by the amplifier, the trigger device supplying trigger signals to the sample/hold unit to trigger sampling by the sample/hold unit, the input of the sample/hold unit having a DC amplifier connected ahead of it and the output of this sample/hold unit being coupled through a further DC amplifier and a resistor to the signal input of the amplifier.

6. In the circuit of claim 5, wherein the DC amplifier which follows the sample/hold unit is variable in amplification and the resistor which follows the DC amplifier variable in resistance.

7. In a charge amplifier circuit, wherein an output of the amplifier is fed back through a drift compensating device, the drift compensating device being connected to a trigger device which directs a trigger signal to the drift compensating device to cause the drift compensating device to generate a compensating current corresponding to drifting of an output signal of the amplifier, the compensating current being directed to an input of the amplifier; the improvement comprising:

the drift compensating device including a sample/-hold unit coupled to the trigger device and the output of the amplifier so that the drift is compensated according to drift values sampled between periodically occurring signals amplified by the amplifier, the trigger device supplying trigger signals to the sample/hold unit to trigger sampling by the sample/hold unit, there being coupled to the trigger signal input of the sample/hold unit, an interval-monitoring unit which switches over the trigger signal to "high" and thereby to continuous drift compensation, whenever a predetermined time interval is exceeded.

8. A circuit comprising:

a charge amplifier having an input and an output; and drift compensating means for compensating drifting of a signal output by said charge amplifier, said drift compensation means including a sample/-hold unit having a first input coupled to said output of said charge amplifier and an output coupled to input of said charge amplifier, said drift compensating means further including triggering means coupled to a second input of said sample/hold unit for generating a trigger signal that is used to trigger sampling by said sample/hold unit between intervals of periodically occurring peaks in said signal output by said charge amplifier, said triggering means being coupled to said output of said charge amplifier by means of a comparator unit so as to supply triggering pulses between occurrences of said peaks in said output signal of said charge amplifier, and said drift compensating means providing a compensating current at said input of said charge amplifier.

9. A circuit comprising:

a charge amplifier having an input and an output; and a drift compensating means for compensating drifting of a signal output by said charge amplifier, said drift compensating means including a sample/-hold unit having a first input coupled to said output of said charge amplifier and an output coupled to input of said charge amplifier, said drift compensating means further including triggering means coupled to a second input of said sample/hold unit for generating a trigger signal that is used to trigger sampling by said sample/hold unit between intervals of periodically occurring peaks in said signal output by said charge amplifier, and said drift compensating means providing a compensating current at said input of said charge amplifier;

a first DC amplifier being connected between said first input of said sample/hold unit and said output of said charge amplifier; and a second DC amplifier and resistor connected in series being connected between said output of said sample/hold unit and said input of said charge amplifier.

10. A circuit comprising:

a charge amplifier having an input and an output; and drift compensating means for compensating drifting of a signal output by said charge amplifier, said drift compensating means including a sample/hold unit having a first input coupled to said output of said charge amplifier and an output coupled to input of said charge amplifier, said drift compensating means further including triggering means coupled to a second input of said sample/hold unit for generating a trigger signal that is used to trigger sampling by said sample/hold unit between intervals of periodically occurring peaks in said signal output by said charge amplifier, said triggering means including a signal generator which produces signals associated with the occurrence of processes giving rise to the peaks in the output signal of the charge amplifier, said triggering means including a comparator unit coupled to said output of said charge amplifier so as to operatively generate said trigger signal, and said drift compensating means providing a compensating current at said input of said charge amplifier.

11. In a method for compensating drifting of an output signal of a charge amplifier, the steps of:

(a) generating a trigger signal having triggering pulses, said pulses being associated with processes by giving rise to peaks in said output signal of said charge amplifier;

(b) sampling said output signal of said charge amplifier upon triggering by said trigger signal;

(c) hold each sample until sampling is again triggered;

(d) providing a compensating signal to an input of said charge amplifier so as to compensate drifting thereof; and producing a continuous trigger pulse to cause continuous sampling and compensation whenever the interval between previous trigger pulses exceeds a predetermined period.

* * * * *